US006930565B1

(12) United States Patent
Vishinsky

(10) Patent No.: US 6,930,565 B1
(45) Date of Patent: Aug. 16, 2005

(54) FULLY INTEGRATED AUTOMATICALLY-TUNED RF AND IF ACTIVE BANDPASS FILTERS

(76) Inventor: Adam S. Vishinsky, 1512 Highland Cir., Little Elm, TX (US) 75068-3787

( * ) Notice: Subject to any disclaimer, the term of this patent is extended or adjusted under 35 U.S.C. 154(b) by 33 days.

(21) Appl. No.: 10/915,487

(22) Filed: Aug. 11, 2004

Related U.S. Application Data

(63) Continuation-in-part of application No. 10/423,923, filed on Apr. 28, 2003.

(51) Int. Cl.[7] .............................................. H04B 3/04
(52) U.S. Cl. ....................... 333/17.1; 333/202; 455/339
(58) Field of Search ............................... 333/13, 14, 2, 333/3, 17.1, 174; 375/235, 240, 254, 296, 375/298, 350; 455/313, 323, 326, 334, 338–341; 327/552, 553, 555, 557

(56) References Cited

U.S. PATENT DOCUMENTS

| | | | |
|---|---|---|---|
| 3,997,856 A | 12/1976 | Canning et al. | |
| 4,175,254 A * | 11/1979 | Manfreda | ................. 455/196.1 |
| 4,438,529 A | 3/1984 | Sato | |
| 4,952,891 A | 8/1990 | Moulding | |
| 5,072,298 A | 12/1991 | Sumiyoshi | |
| 5,210,504 A | 5/1993 | Yagita et al. | |
| 5,303,228 A | 4/1994 | Tzeng | |
| 5,345,119 A | 9/1994 | Khoury | |
| 5,440,264 A | 8/1995 | Sevenhans et al. | |
| 5,471,168 A | 11/1995 | Sevenhans et al. | |
| 5,608,665 A | 3/1997 | Wyszynski | |
| 5,625,317 A * | 4/1997 | Deveirman | ................... 327/553 |
| 5,731,737 A * | 3/1998 | Cranford et al. | ............. 327/553 |
| 5,737,035 A | 4/1998 | Rotzoll | |
| 5,781,851 A * | 7/1998 | Saito | ......................... 455/182.1 |
| 5,896,061 A * | 4/1999 | Behrent | ....................... 329/308 |
| 5,912,583 A | 6/1999 | Pierson et al. | |
| 5,914,663 A | 6/1999 | Whitehad | |
| 6,031,878 A | 2/2000 | Tomasz et al. | |
| 6,148,048 A | 11/2000 | Keith et al. | |
| 6,177,964 B1 | 1/2001 | Birleson et al. | |
| 6,226,323 B1 * | 5/2001 | Tan et al. | .................... 375/233 |
| 6,285,865 B1 | 9/2001 | Vorenkamp et al. | |
| 6,356,736 B2 | 3/2002 | Tomasz et al. | |
| 6,377,315 B1 | 4/2002 | Carr et al. | |
| 6,404,277 B1 | 6/2002 | Lee et al. | |
| 6,417,727 B1 | 7/2002 | Davis | |
| 6,496,230 B1 | 12/2002 | Limberg et al. | |
| 6,546,061 B2 * | 4/2003 | Signell et al. | .............. 375/316 |
| 6,662,001 B1 * | 12/2003 | Roth | .......................... 455/314 |
| 6,704,560 B1 * | 3/2004 | Balteanu et al. | ............. 455/333 |

* cited by examiner

Primary Examiner—Tuan T. Lam
Assistant Examiner—Hai L. Nguyen
(74) Attorney, Agent, or Firm—Locke Liddell & Sapp LLP

(57) ABSTRACT

An automatic tuning scheme for two active band-pass filters where both filters operate on the signal while simultaneously being tuned using a reference signal. To allow that the amplitude of a reference signal is made small and since both filters demonstrate a good linearity the build-up of the inter-modulation distortion does not occur. The first band-pass filter is tuned with the reference falling into its pass-band. The second band-pass filter is also tuned with the reference placed into its pass-band. The reference is practically eliminated by the virtue of the complexity of the second band-pass filter. Assuming the filter passes the signal for positive frequencies if the reference is made a negative frequency by appropriate 90 degrees phase shifting it will be attenuated by at least 55 dB, which is a sufficient signal-to-reference ratio.

9 Claims, 16 Drawing Sheets ical Field of the Invention

FULLY INTEGRATED AUTOMATICALLY-TUNED RF AND IF ACTIVE BANDPASS FILTERS

RELATED APPLICATION

This application is a continuation-in-part of U.S. application Ser. No. 10/423,923 filed Apr. 28, 2003 and entitled "Fully Integrated Automatically Tuned FR and IF Active Bandpass Filters" and claims the benefit therefrom.

TECHNICAL FIELD OF THE INVENTION

The present invention relates to fully-integrated continuous-time active band-pass filters and their automatic frequency- and Q-tuning systems.

BACKGROUND OF THE INVENTION

Nearly all practical transceivers require some form of filtering. Up to the date, in majority of cases, these radio-frequency (RF) and intermediate-frequency (IF) filters are realized off-chip as ceramic or surface-acoustic wave (SAW) devices.

A first reason for slow progress in integration RF and IF filters is their rather modest noise and distortion performance. This can be alleviated by a careful overall system design by taking into account the filter short comings and by purposely reducing their requirements while simultaneously offsetting their reduced performance with superior performance of preceding and following high-quality blocks.

A second reason for slow progress in integration RF and IF filters is that these filters require circuitry for adjusting their center or corner frequency as well as their quality-, or (Q)-factors. The accuracy problems of such tuning systems may result in the whole filter not meeting the stringent system specifications over process, voltage supply and temperature variation (PVT). Due to the matching errors the most frequently used Master-Salve (M-S) schemes suffer from significant accuracy errors averaging up to 5% for frequency schemes and up to several tens of percent for Q-tuning schemes. Naturally, for majority radio applications such a modest accuracy is not acceptable. Additionally, the reference feed-through degrades the overall noise performance of the filter. The typically achievable S/N ratio of an active filter tuned with a M-S scheme is about 40 dB.

A third reason for slow progress in integration RF and IF filters is taking full advantage of possible system and circuit trade-offs during the transceiver design. In order to make a design of RF or IF filters viable, their system specification should be optimized and carefully negotiated with the overall system specifications. In other words, for a successful implementation of a fully-integrated transceiver the sequence of specification building should be reversed: knowing the limitations of the active filters one should design the system architecture, its system specifications and other circuits to alleviate these shortcomings. Only then the whole system has a chance to meet its overall requirements.

In the case of the presented RF and IF filters the tuning accuracy can be substantially improved with tuning the filter signal directly instead of using the Master-Slave (M-S) scheme by passing the reference through it while simultaneously processing the signal. The expected accuracy of such frequency- and Q-tuning systems could reach 0.5% and 2% respectively. There are certain requirements for the reference signal that need to be fulfilled:

its frequency should fall at the edge of the pass-band of the RF filter, but its frequency should be chosen so that it will not inter-modulate with the adjacent channel carrier;

the reference amplitude of the FR filter should be at least 15 dB lower than the selected channel carrier;

given these conditions the reference passes the RF band-pass (BP) filter linearly without causing inter-modulation distortion. Suppose that the reference frequency it is $\Delta f$ away from the desired channel carrier. Give the attenuation characteristic of the IF BP filter $\Delta f$ separation should be chosen such that the IF BP filter attenuates the reference of the RF BP filter by at least 40 dB;

hence, at the output the signal and the reference differ at least by 55 dB, which is better than the reference feed-through of a typical M-S scheme;

the reference of the IF BP filter is rejected by its appropriate conditioning with respect to the main signal and the complex nature of the IF BP filer. The expected attenuation of the IF BP filter reference is at least 55 dB.

DESCRIPTION OF THE PRIOR ART

The architecture of a classical Master-Slave (M-S) tuning scheme such as one described in U.S. Pat. No. 3,997,856 is illustrated in FIG. 1, and is identified by the numeral 10. Note that only a frequency-tuning scheme is presented in U.S. Pat. No. 3,997,856. The Q-tuning scheme is not disclosed in that patent. The frequency-control part consists of a Master filter (or Master oscillator) 12 followed by the frequency-tuning circuit 14 that similarly to U.S. Pat. No. 3,997,856 may consist of a phase-detector, a low-pass filter and a differential amplifier. These blocks are not drawn separately here for the sake of simplicity. The Q-control part of the scheme consists of the same Master filter (or Master oscillator) 12 followed by the Q-tuning circuit 16. It may consist of an amplitude detection circuit and a differential amplifier. Again, for the sake of simplicity these blocks are not drawn separately here. Since the frequency- and Q-control loops directly control the Master circuit 12 and not the Slave filter 18 due to unavoidable on-chip matching errors the expected accuracy of the M-S frequency scheme could be as low as 5% for frequency-tuning and up to several tens of percent for Q-tuning.

The architecture of a typical filter wafer-probe trimming scheme is illustrated in FIG. 2, and is identified by the numeral 20. It consists of the $g_m$-C oscillator circuit 22 with its output connected to the phase detector 24. The frequency reference is applied to the second input of the phase detector 24. The difference signal at the output of the phase detector 24 is low-pass filtered by filter 26 and applied to the input of a high-gain amplifier that controls $g_m$ of the oscillator circuit 22. During the one-time wafer-probe procedure the oscillation frequency is measured and compared to the frequency reference. The resulting error is used by a negative feedback loop to adjust the $g_m$ of the oscillator, which is built with the same $g_m$-amplifiers as the tuned filter. After the filter $g_m$ amplifiers are adjusted their value becomes fixed, the oscillator and the rest of the trimming circuitry are disabled and the filter $g_m$ amplifiers and its frequency track the temperature by the virtue of its temperature independent biasing. The accuracy of the wafer-probe scheme is expected to be worse than the M-S scheme. The reason is that the wafer-probe scheme demonstrates the M-S accuracy at the beginning, but then after the Master is disabled it relies entirely on the biasing. Since the biasing introduces an extra error by not being able to track the temperature variation perfectly the overall accuracy of the wafer-probe scheme can be as low as 10% for frequency-tuning, which is still useful for some less demanding applications. However, because of the low accuracy, the Q-tuning is not practical using wafer-probe scheme.

The architecture of a proposed self-tuned filter scheme is illustrated in FIG. 3, and is identified by the numeral 30. It consists of two filters 31 and 32. Using switches 33 and 34, when the first of filters 31 and 32 has its input connected to the input signal the other one is tuned and then their roles are interchanged. The outputs of filters 31 and 32 are switched using switches 35 and 36. The frequency reference is applied to the frequency-tuning circuit 39 that generates control signals via hold circuits 37 and 38 for tuning the one of the filters 31 and 32 that is not processing the input signal. The critical difficulty of this scheme is switching the filters on and off the signal such that transients are avoided. As far as accuracy is concerned the proposed self-tuning achieves higher-accuracy than that of M-S scheme. Its tuning accuracy error is related to the overall error of the frequency-tuning scheme, which can be as low as 0.5%.

SUMMARY OF THE INVENTION

The present automatic tuning scheme for two BP filters is used in a fully-integrated heterodyne receiver such as one in FIG. 16. Contrary to other tuning schemes both filters operate on the signal while simultaneously being tuned using a reference signal. To allow that the amplitude of reference signal is made small and since both filters demonstrate a good linearity the build-up of the inter-modulation distortion does not occur. For accuracy reasons the first BP is tuned with the reference falling into its pass-band. Under such conditions the reference is not practically attenuated by the first BP filter. However the same distance between the pass-band center and the reference frequency in the second BP filter results in about 40 dB attenuation of the first BP reference. This is because the second BP bandwidth is much narrower than the first BP bandwidth. At lower IF frequency its order and its Q's can be made sufficiently high to achieve sufficient attenuation. This combined with at least 15 dB the original signal-to-reference ratio results in the desired 55 dB the final signal-to-reference ratio. However, the second band-pass is also tuned. Since there is no further filter in the signal path its tuning reference cannot be removed. To solve this problem the complexity of the second BP is exploited. Assuming the filter passes the signal for positive frequencies if the reference is made a negative frequency by appropriate 90 degrees phase shifting it will be attenuated by at least 55 dB, which is a sufficient signal-to-reference ratio.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
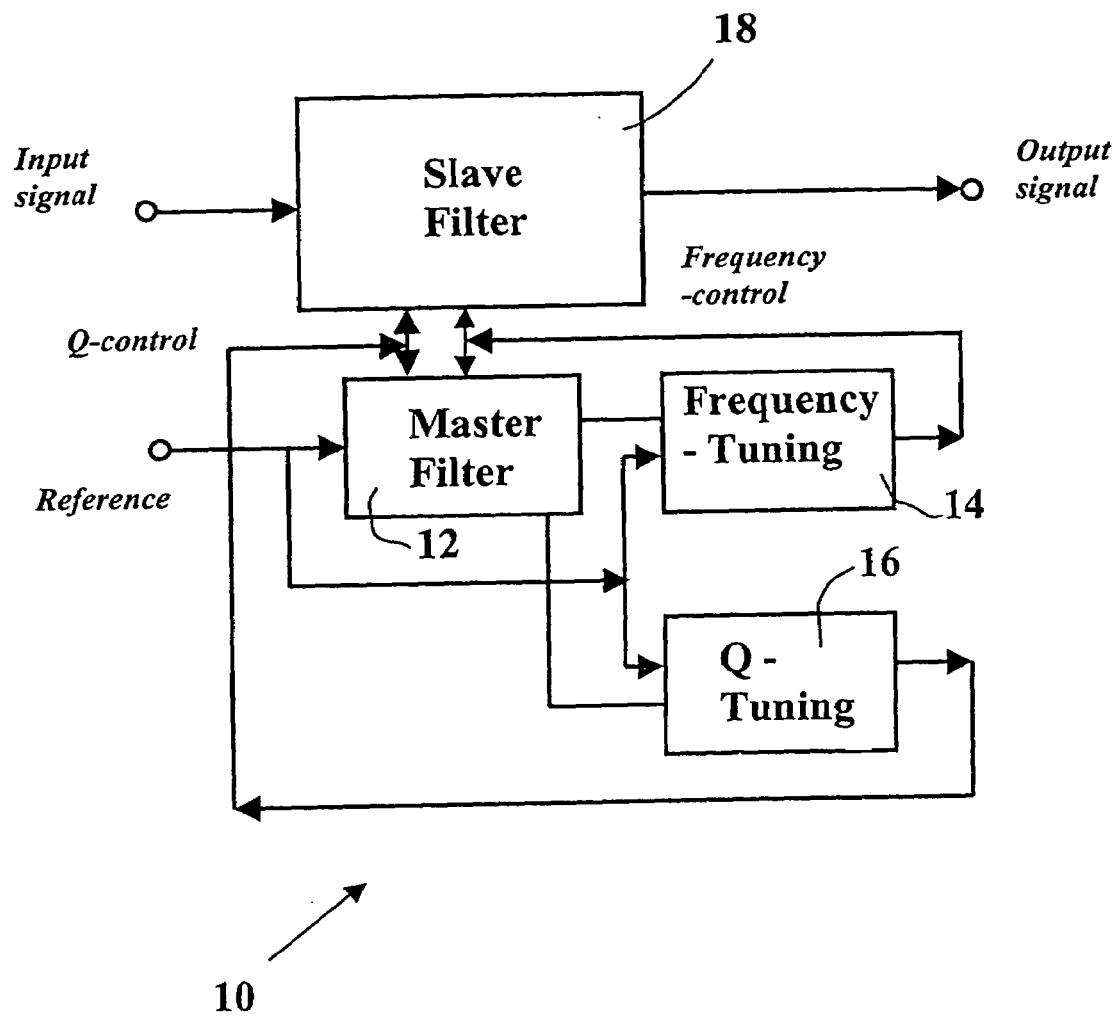
FIGS. 1, 2 and 3 are block diagrams of prior art tuning schemes.
Figure 2:
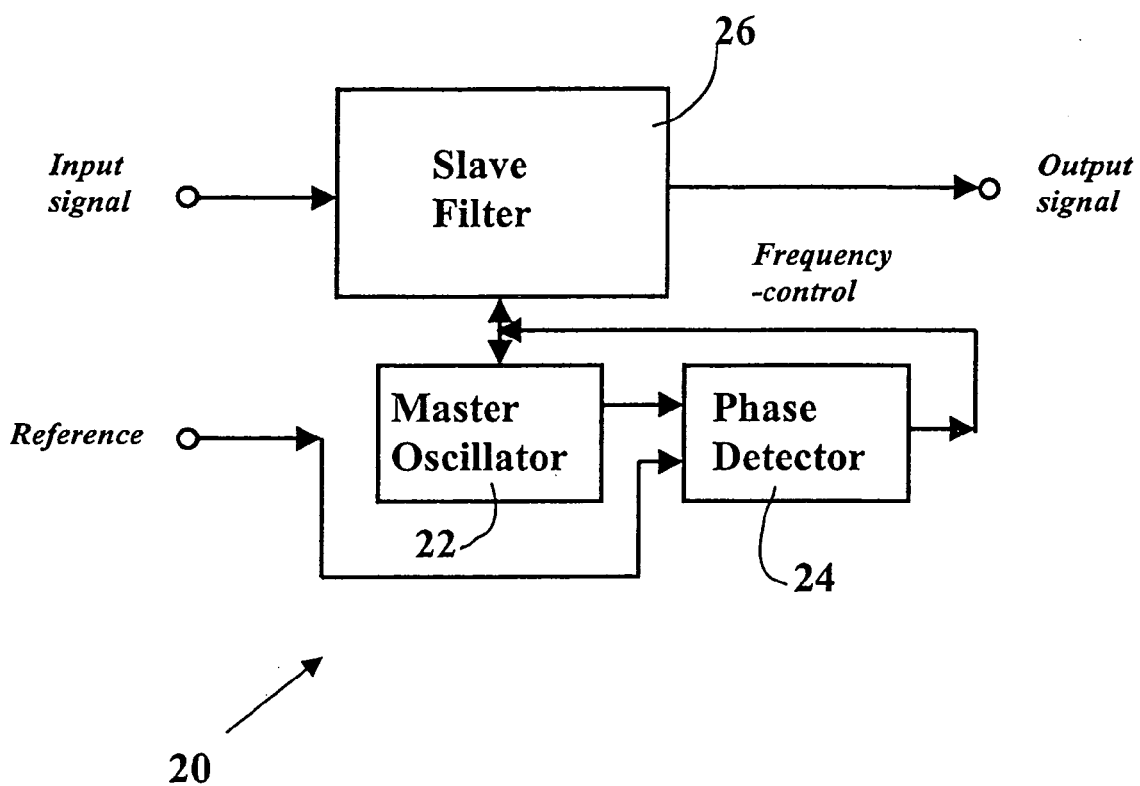
Figure 3:
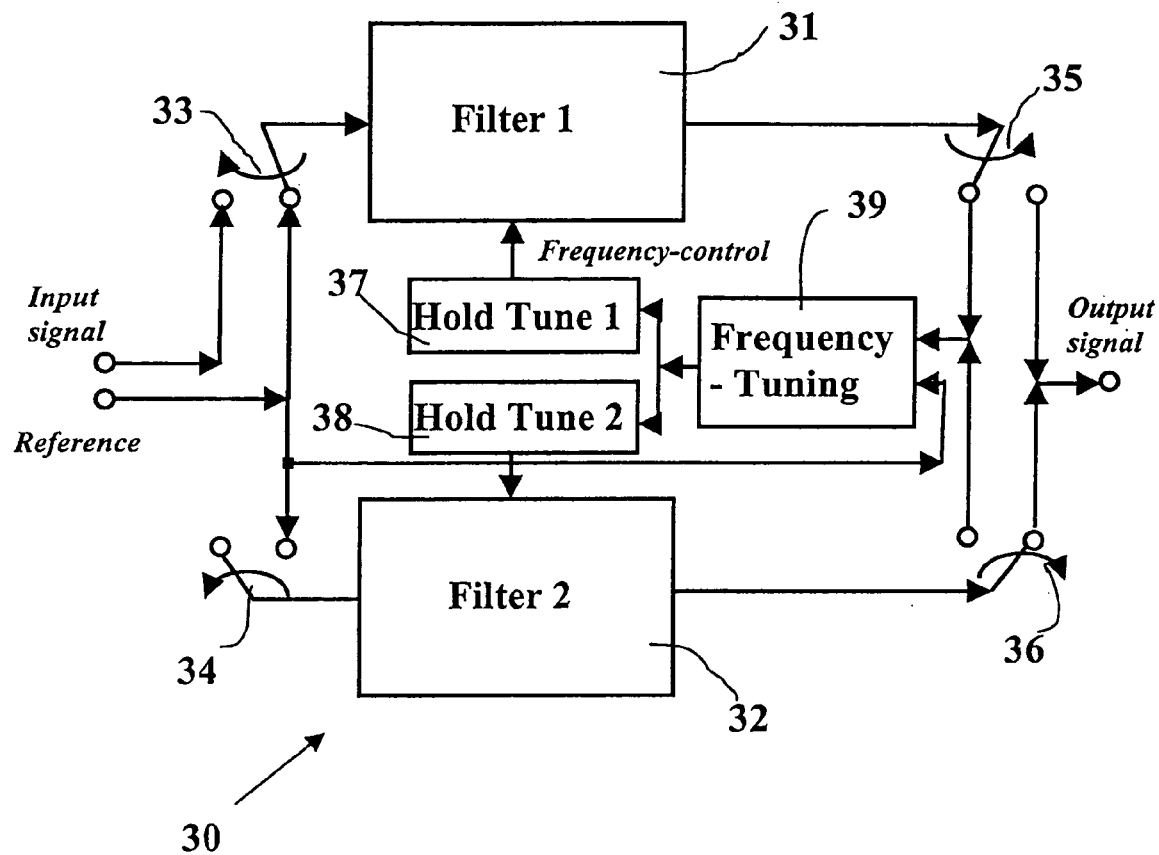
Figure 4:
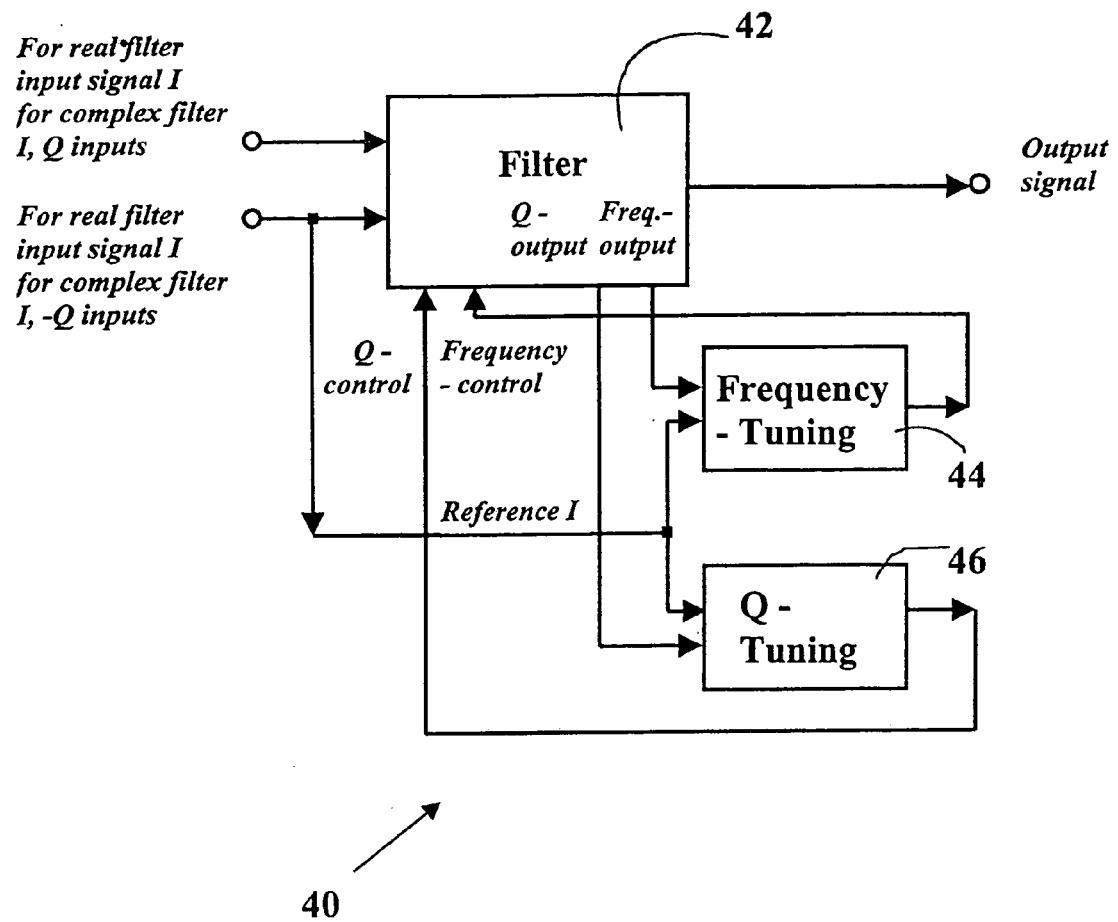
FIG. 4 is a block diagram of the present automatically tuned band-pass filter equipped with frequency- and Q-tuning schemes that operate while the filter is processing the signal.

Referring to the FIG. 4, the present automatically-tuned filter system is illustrated, and is generally identified by the numeral 40. The input and reference signal enter the filter circuit 42, one of the filter outputs is connected to the frequency-tuning block 44 and the other one is connected to the Q-tuning block 46. The output of the frequency-tuning block 44 is then fed back to the filter 42 in order to control its frequency. Similarly, the output of the Q-tuning block 46 is then fed back to the filter 42 in order to control its Q.

Figure 5:
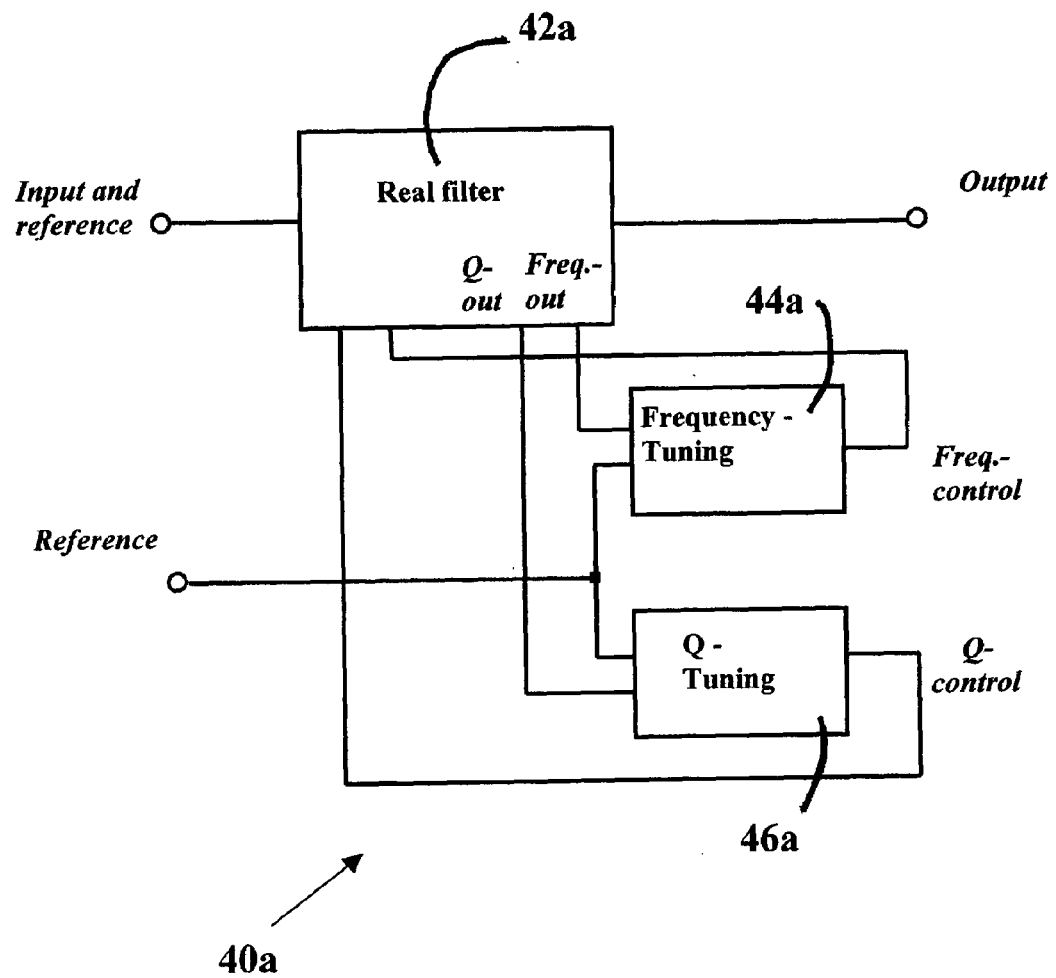
FIG. 5 illustrates the concept of a tuning scheme for the real RF BP filter.

Referring to the FIG. 5, the present automatically-tuned real RF BP filter system is illustrated, and is generally identified by the numeral 40a. The input and reference signals enter the filter circuit 42a and the reference signal enters the frequency-tuning block 44a and the Q-tuning block 46a. One of the filter outputs is connected to the frequency-tuning block 44a and the other is connected to the Q-tuning block 46a. The output of the frequency-tuning block 44a is fed back to the filter 42a in order to control its frequency. Similarly, the output of the Q-tuning block 46a is fed back to the filter 42a in order to control its Q-factor. It should be noted that the filter input, outputs and the reference signals as well as the frequency- and Q-control signals may be single-ended as indicated for its simplicity in FIG. 5, but in most practical cases they will be differential, or balanced around a dc common-mode voltage.

Figure 6:
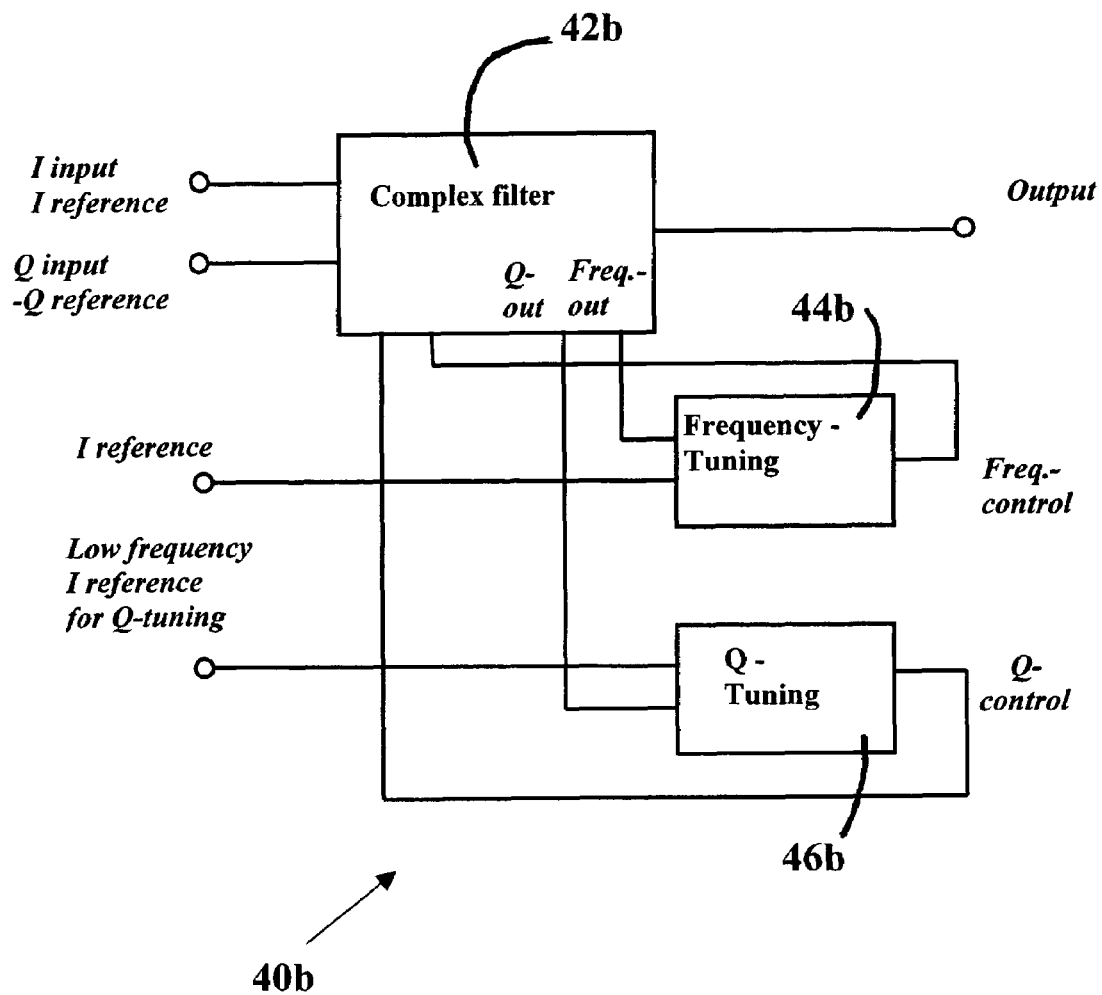
FIG. 6 illustrates the concept of tuning scheme for the complex IF BP filer.

Referring to the FIG. 6, the present automatically-tuned complex IF BP filter system is illustrated, and is generally identified by the numeral 40b. The input I, Q signals and the reference I, -Q signals enter the filter circuit 42b. The reference I signal enters the frequency-tuning block 44b and the low-frequency reference I signal enters the Q-tuning block 46b. One of the filter I outputs is connected to the frequency-tuning block 44b and the other I output is connected to the Q-tuning block 46b. The output of the frequency-tuning block 44b is fed back to the filter 42b in order to control its frequency. Similarly, the output of the Q-tuning block 46b is fed back to the filter 42b in order to control its Q-factor. It should be noted that the filter I, Q inputs, outputs and the Q, I reference signals as well as the frequency- and Q-control signals may be single-ended as indicated for its simplicity in FIG. 6, but in most practical cases they will be differential, or balanced around a dc common-mode voltage.

Figure 7:
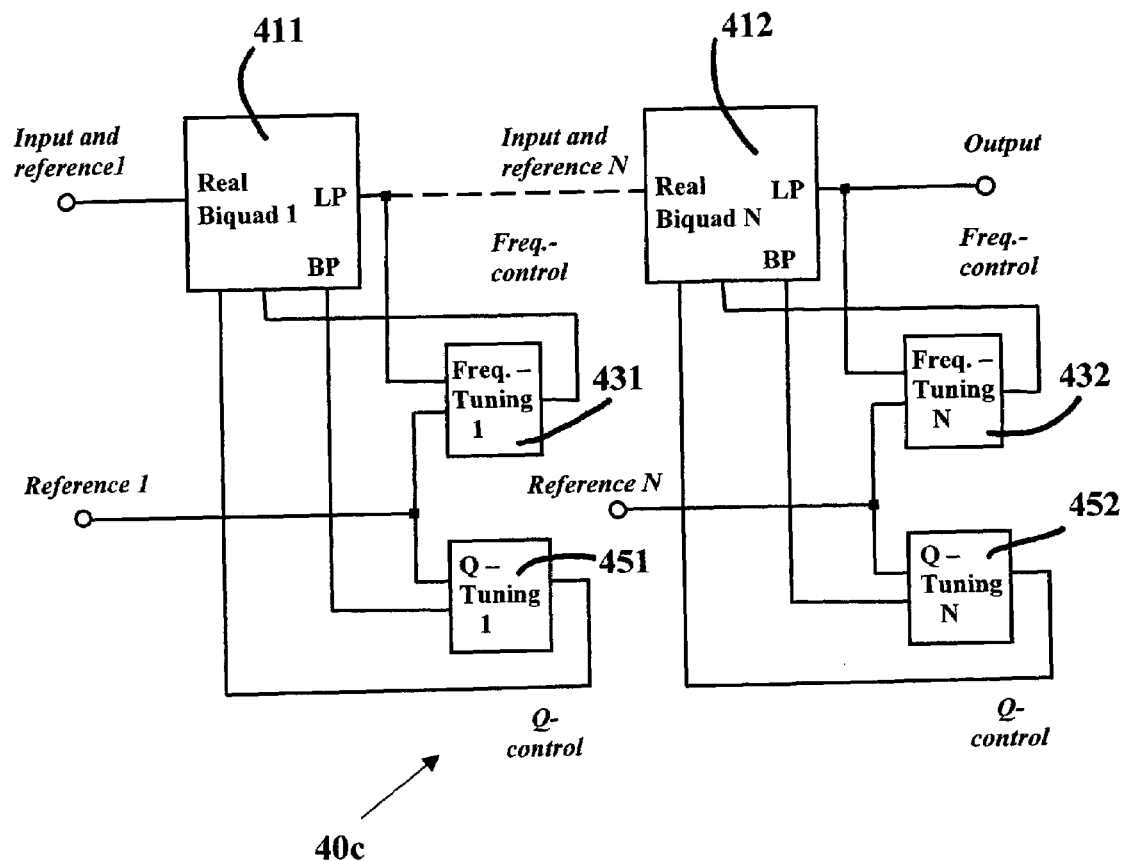
FIG. 7 presents more detailed arrangement for the tuning scheme of the real RF BP filter built with second-order biquad sections.

Referring to the FIG. 7, the present automatically-tuned real RF BP filter system is illustrated, and is generally identified by the numeral 40c. The filter is built as a cascade of N second-order sections (biquads). Since each biquad have a different center frequency, for the accuracy purpose they need to be tuned separately. Therefore, each of the filter biquads 411, 412 has its own dedicated frequency- 431, 432 and Q-tuning 451, 452 schemes as well as a separate reference signal. The input and reference signals enter each of the filter biquads 411, 412 and the reference signals enter each the frequency-tuning blocks 431, 432 and the Q-tuning block 451, 452. The LP output of each biquad is connected to the frequency-tuning block 431 or 432 and the BP output is connected to the Q-tuning block 451 or 452. The output of the frequency-tuning blocks 431 and 432 is fed back to the appropriate biquad 411 or 412 in order to control its frequency. Similarly, the output of the Q-tuning blocks 451 or 452 is fed back to the appropriate biquad 411 or 412 in order to control its Q-factor. It should be noted that the filter input, outputs and the reference signals as well as the frequency- and Q-control signals may be single-ended as indicated for its simplicity in FIG. 7, but in most practical cases they will be differential, or balanced around a dc common-mode voltage.

Figure 8:
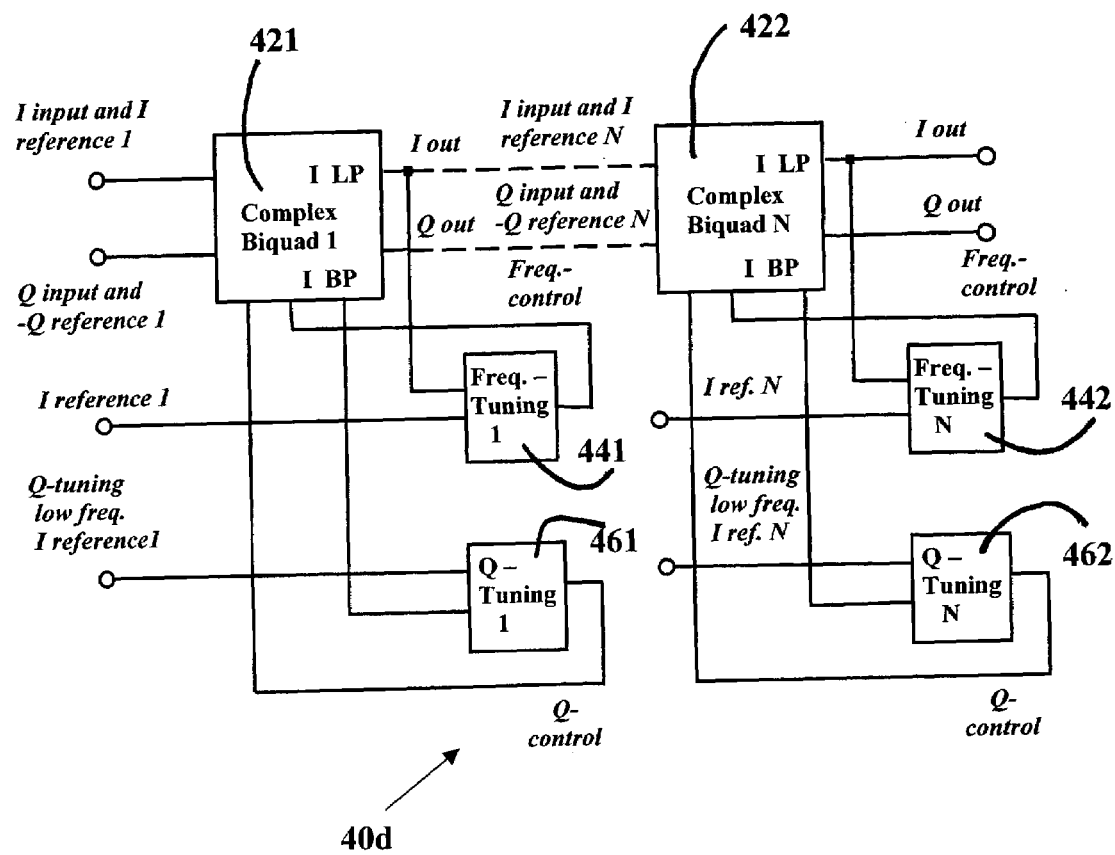
FIG. 8 presents more detailed arrangements for the tuning scheme the complex IF BP filter built with second-order biquad sections.

Referring to the FIG. 8, the present automatically-tuned complex IF BP filter system is illustrated, and is generally identified by the numeral 40d. The filter is built as a cascade of N complex second-order sections (biquads). Since each biquad have a different center frequency, for the accuracy purpose they need to be tuned separately. Therefore, each of the filter biquads 421, 422 has its own dedicated frequency- 441, 442 and Q-tuning 461, 462 schemes as well as a separate reference signal. The input I, Q signals and reference I, -Q signals enter each of the filter biquads 421, 422, the reference I signals enter each of the frequency-tuning blocks 441, 442 and the low-frequency reference I signals enter each of the Q-tuning blocks 461, 462. The I LP output of each biquad is connected to the frequency-tuning block 441 or 442 and the I BP output is connected to the Q-tuning block 461 or 462. The output of the frequency-tuning block 441 or 442 is fed back to the appropriate biquad 421 or 422 in order to control its frequency. Similarly, the output of the Q-tuning block 461 or 462 is fed back to the appropriate biquad 421 or 422 in order to control its Q-factor. It should be noted that the filter I, Q inputs, outputs and the I, -Q reference signals as well as the frequency- and Q-control signals may be single-ended as indicated for its simplicity in FIG. 8, but in most practical cases they will be differential, or balanced around a dc common-mode voltage.

The output of the filter 42 may also serve as a frequency- and/or Q-tuning output. In such a case the original frequency- or Q-tuning output(s) is (are) redundant and is (are) not used.

Figure 9:
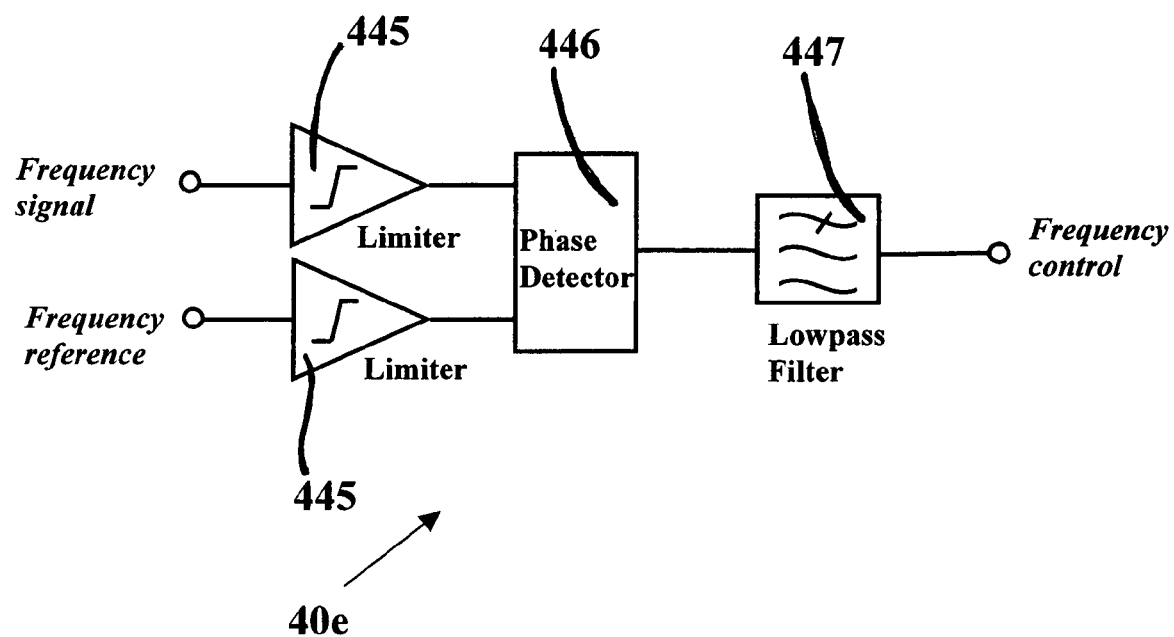
FIG. 9 presents the schematic of implementation of frequency-tuning scheme used both in the real RF BP and complex IF BP filters.

Referring to the FIG. 9, the frequency-tuning for an automatically-tuned real RF BP or a complex IF BP filter systems is illustrated, and is generally identified by the numeral 40e. A pair of limiters 445 limits the frequency-output signal and the reference signal. Their outputs are connected to a phase-detector 446 that can be a sequential detector or a XOR/XNOR gate. The output of the phase detector 446 is filtered by a lowpass filter 447. The output of filter 447 (Frequency control) is fed back to the filter 42a (FIG. 5) and 42b (FIG. 6) in order to control the frequency of filters 42a and 42b. The frequency-tuning block in FIG. 9 generates a voltage that is proportional to the frequency of the filter. As an example in $g_m$-C filters, the filter frequency is proportional to the ratio $g_m/C$ of transconductance $g_m$ and the capacitance C. By changing the voltage that controls the bias of transconductors and their $g_m$-value the frequency tuning effect is achieved. Other standard techniques to tune other types of analog filters using a voltage can be also used. It should be noted that the filter output, the reference signals and the frequency-control signals may be single-ended as indicated for its simplicity in FIG. 9, but in most practical cases they will be differential, or balanced around a dc common-mode voltage. In such a case the limiters 445, the phase-detector 446 and the lowpass filter 447 need to be realized as fully differential or balanced blocks.

Figure 10:
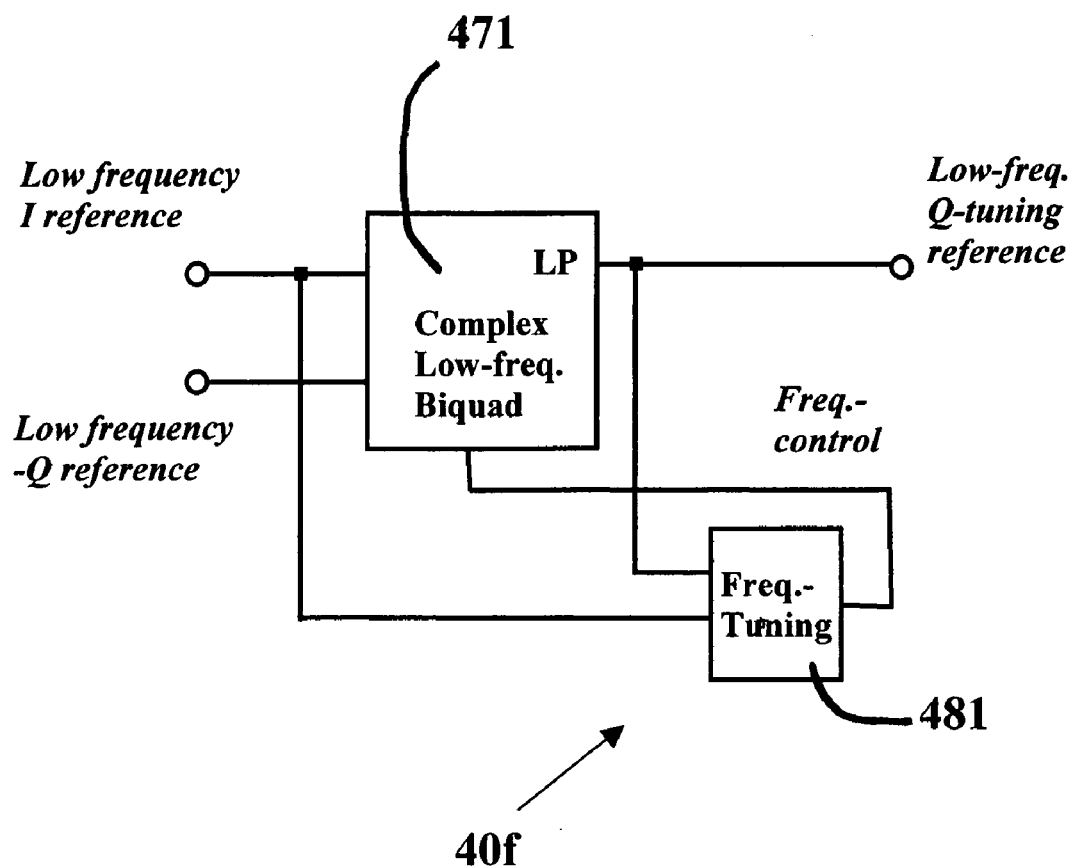
FIG. 10 presents the schematic of implementation for the systems generating low-frequency reference used in Q-tuning scheme of the complex IF BP filter.

Referring to the FIG. 10, the low-frequency reference generating circuit for an automatically-tuned complex IF BP filter Q-tuning system is illustrated, and is generally identified by the numeral 40f. It consists of a low-frequency complex biquad 471 and a frequency-tuning 481. The frequency of the low-frequency reference is chosen to be so low that the excess phase of biquad 471 is negligible and its effective Q is close to the designed Q. Also, since the low-frequency reference biquad is a replica of the filter biquad their image suppression will be similar. The only difference between the attenuation of the low and high reference frequencies is the Q-enhancement of the measured filter.

Figure 11:
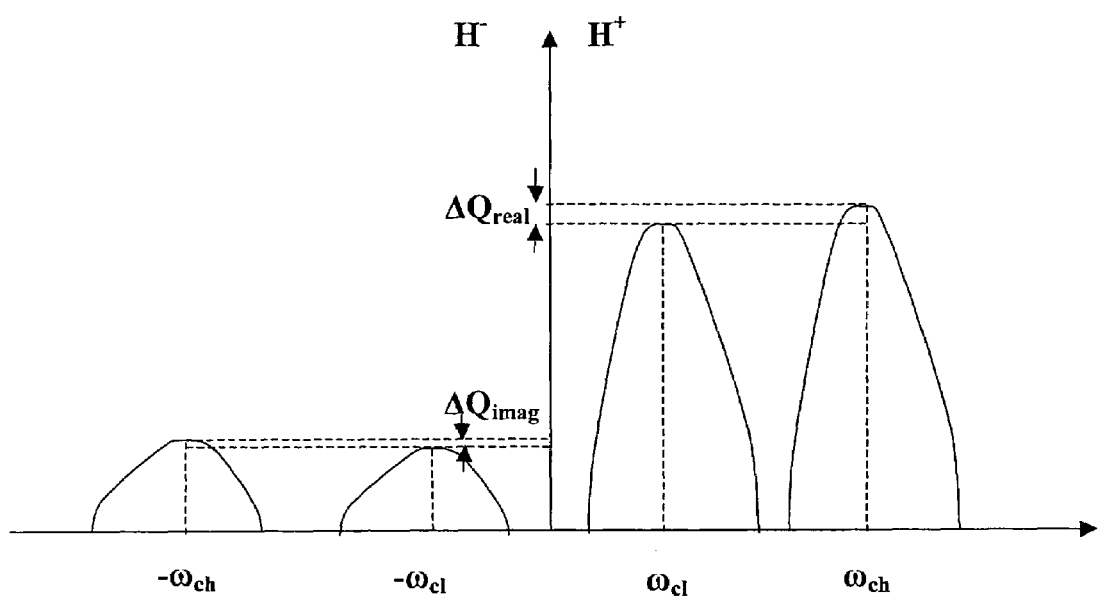
FIG. 11 illustrates the concept of using low-frequency reference for the purpose of Q-tuning in the complex IF BP filter.

Referring to the FIG. 11, the transfer functions for a low- and high-frequency complex biquads for I, Q signals and I, -Q references (image) are illustrated. The main biquad operates at much higher frequency than the low-frequency biquad. Its effective $Q^* = Q/(1 - 2*Q*\Delta\phi) = Q/(1 - 2*Q*(\omega_o/\omega_p))$, where Q is the designed Q, $\Delta\phi$ is its excess phase, $\omega_{ch}$ is the its pole frequency and $\omega_p$ is the pole frequency of its transconductors. Since at the low-frequency the excess phase $\Delta\phi = 0$ the effective Q of the low-frequency biquad is $Q^* \approx Q$. The negative feedback of the Q-tuning system brings the difference between the magnitudes of the biquad image transfer functions $\Delta Q_{imag}$ to zero. It is equivalent to compensate for the excess phase errors of the main biquad.

Figure 12:
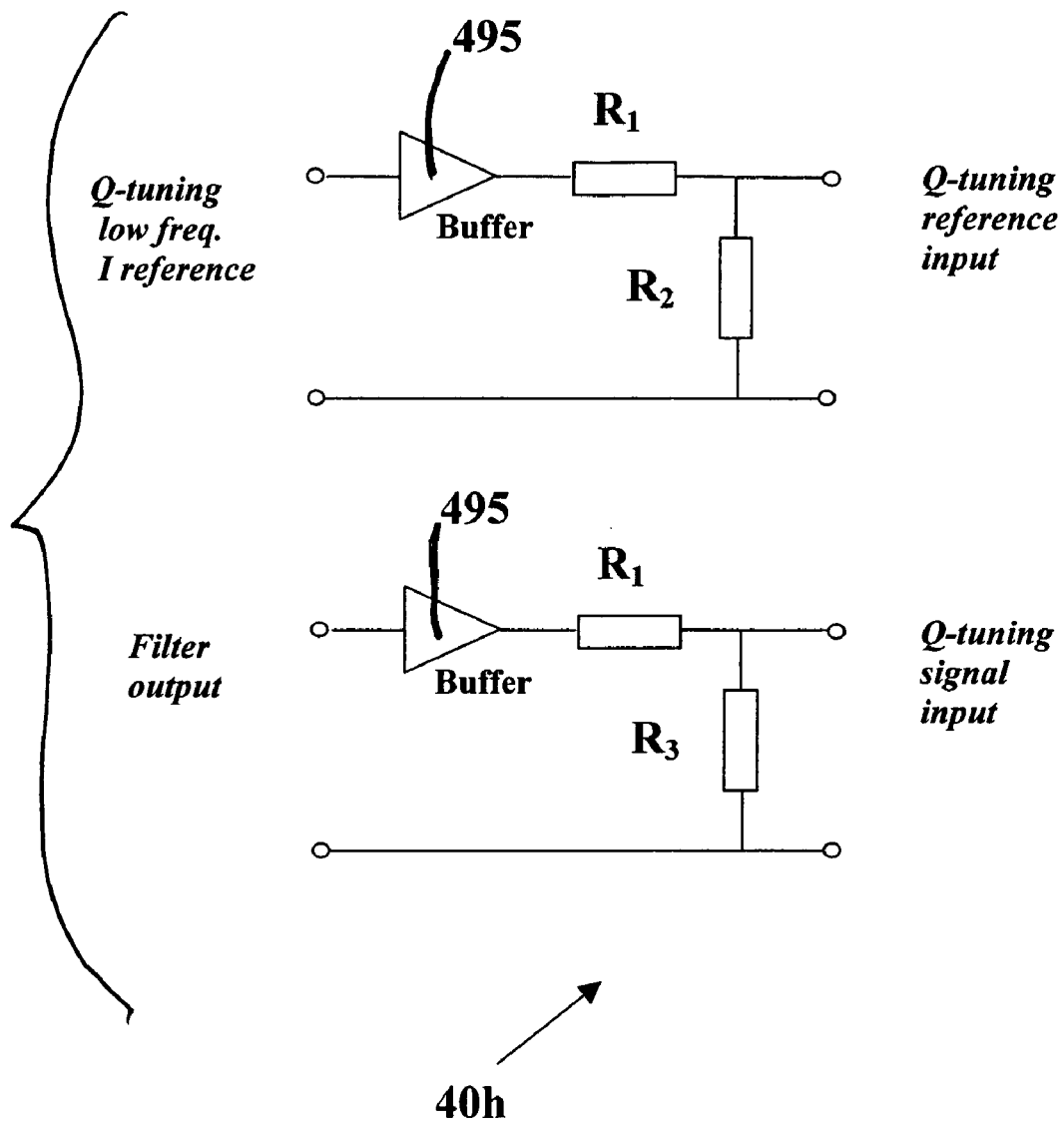
FIG. 12 presents the voltage dividers used to condition the low-frequency reference if the case of sharing such a reference by many biquads in the Q-tuning scheme of the complex IF BP filter.

Referring to the FIG. 12, the reference voltage-dividers for an automatically-tuned complex IF BP Q-tuning system are illustrated, and are generally identified by the numeral 40h. Depending on the required accuracy and available power budget the system may contain one or more low-frequency biquads. Ideally, each filter biquad should have its own low-frequency reference biquad. In such a case the dividers 40h are not required. However, if low-frequency biquad is shared by two or more biquads the dividers are necessary. If the Q of the given biquad is $Q_2$ and the Q of the low-signal biquad is $Q_1$ then the resistor ratios can be easily calculated from $Q_2/Q_1=(R_2/(R_1+R_2))/(R_3/(R_1+R_3))= (R_2/R_3)*(1+(R_1/R_2))/(1+(R/R_3))$. The buffers 495 are added to eliminate the loading effects.

Figure 13:
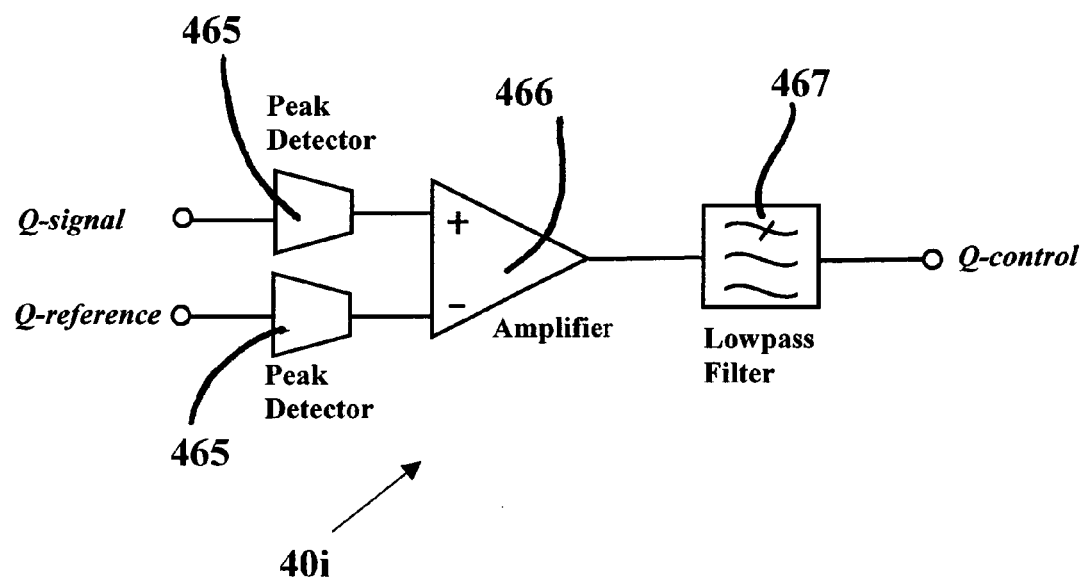
FIG. 13 presents the schematic of implementation of Q-tuning scheme used both in the real RF BP and complex If BP filters.

Referring to the FIG. 13, the Q-tuning for automatically-tuned real RF BP and complex IF BP filter systems is illustrated, and is generally identified by the numeral 40i. The Q-output signal and the low-frequency reference signal are peak-detected by a pair of peak-detectors 465. Their outputs are connected to a differential amplifier 466. The output of the differential amplifier is filtered by a lowpass filter 467 and fed back to the filter in order to control its Q-factor. It should be noted that the filter output, the low-frequency reference signals and the Q-control signals may be single-ended as indicated for its simplicity in FIG. 13, but in most practical cases they will be differential, or balanced around a dc common-mode voltage. In such a case the peak-detectors 465, the differential amplifier 466 and the lowpass filter 467 need to be realized as fully differential or balanced blocks.

Figure 14A:
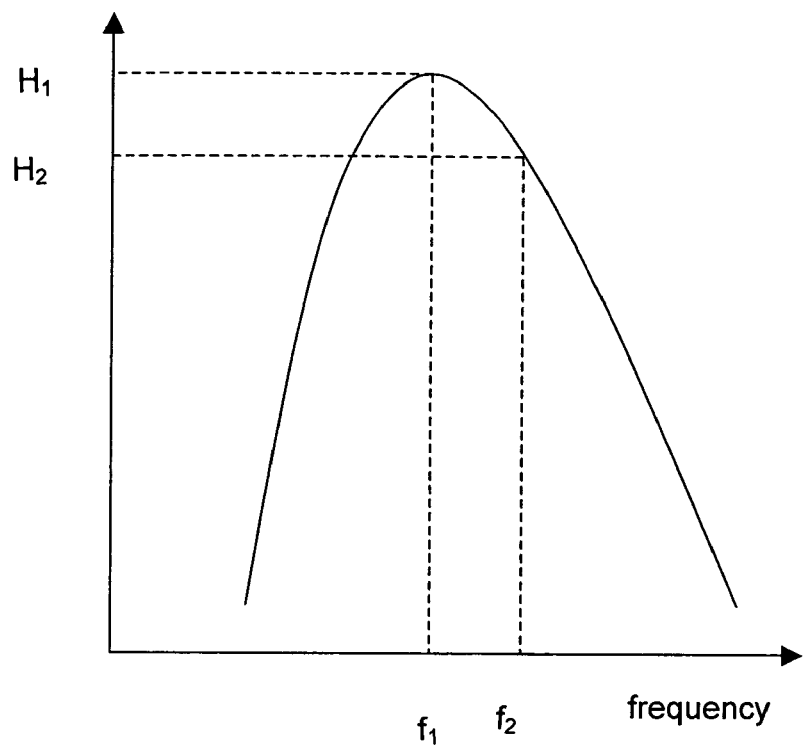
FIGS. 14a and 14b illustrate the attenuation of the signal and the tuning reference of the first BP filter, after passing first BP filter and second BP filter.
Figure 14B:
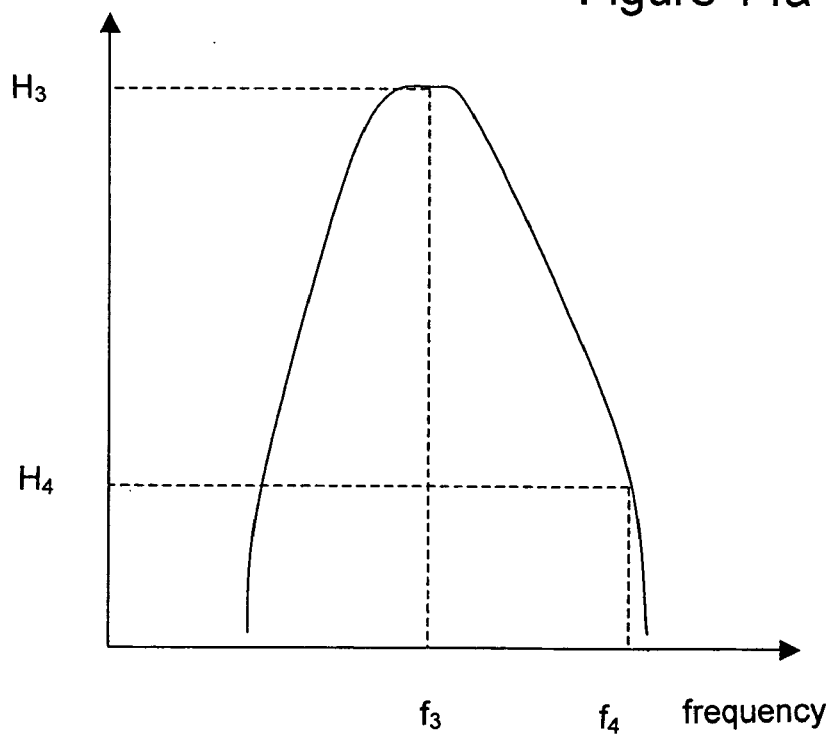
Figure 16:
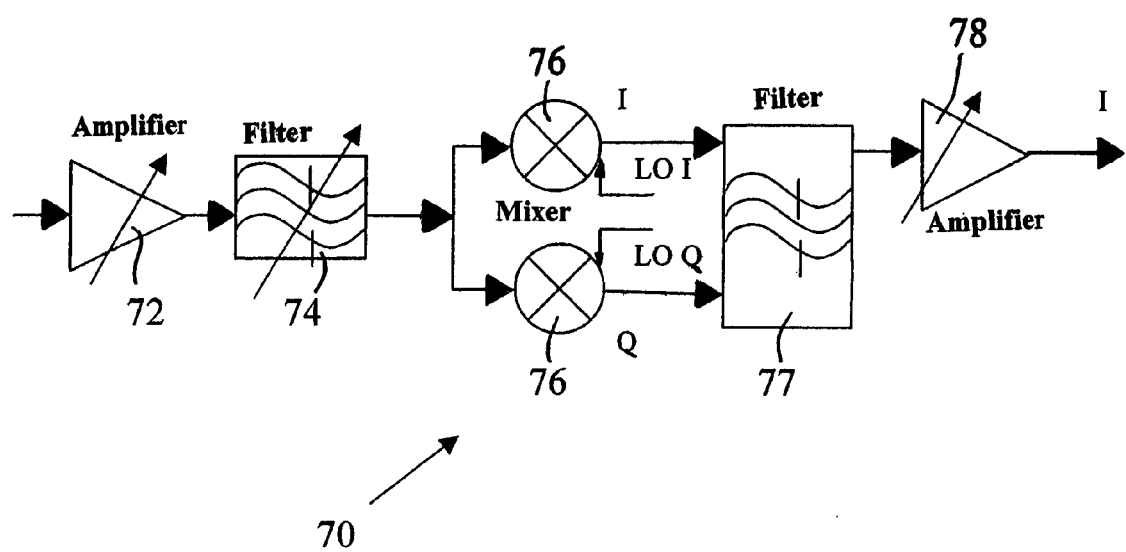
FIG. 16 is a block diagram of the fully integrated heterodyne receiver using the present automatically tuned BP filters.

If the filter circuit 42 is a real band-pass filter such as filter 74 illustrated in FIG. 16 the reference is placed at frequency $f_2$ that is offset from the filter center frequency $f_1$ by $\Delta f=f_2-f_1$. This situation is illustrated in FIG. 14a. Since the reference passes close to the pass-band its amplitude is kept low to avoid any inter-modulation distortion. The reference is attenuated only by about 1–2 dB by filter 74. However, as shown in FIG. 14b filter 77 (FIG. 16) attenuates the reference by at least 40 dB. This is due to the fact that filter 77 is much narrower than filter 74 and since $\Delta f=f_4-f_3$ the reference falls into the filter stop-band. Additionally, since the center frequency of filter 77 is much lower than the of filter 74, $f_3 \ll f_1$, it is easier to implement higher Q's and steeper roll-off for filter 77.

If the filter circuit 42 is a complex BP filter, depending on the input signal conditioning, filter 42 passes certain signals and suppresses the others. Assuming the main signal is passed in the form of I and Q components, with Q lagging I by 90 degrees, if the reference is passed in the form of I and -Q components, with Q leading I by 90 degrees, then the filter 42 attenuates the reference by at least 55 dB compared to the main signal.

Figure 15A:
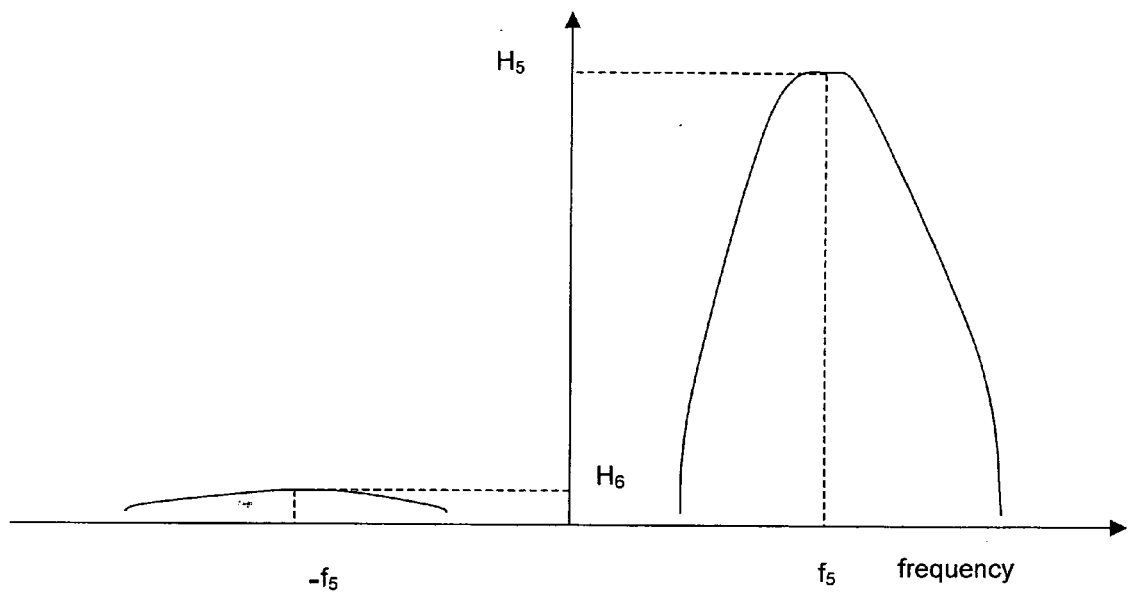
FIG. 15a illustrates the attenuation of the complex second BP filter for I,Q signal conditioning: the signal is passed for positive frequencies and blocked for negative frequencies (image rejection)
Figure 15B:
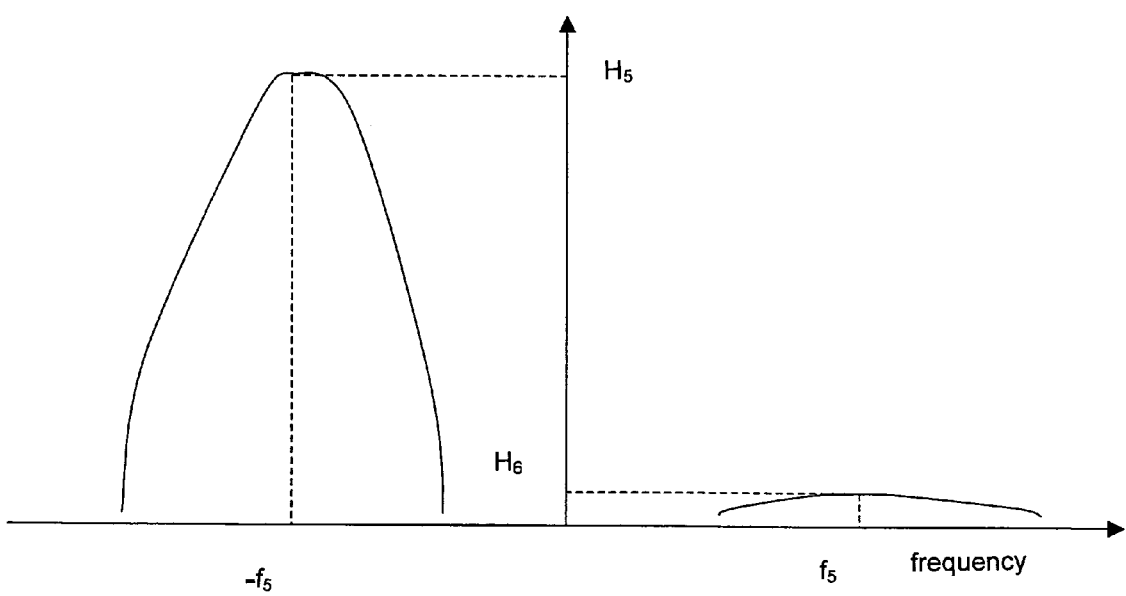
FIG. 15b illustrates the attenuation of complex nature of the second BP filter for I,-Q signal conditioning; the IF BP filter references is passed for negative frequencies and blocked for positive frequencies.

As illustrated in FIG. 15a the main signal characterized by I and Q components is passed by the filter 77 (FIG. 16) for positive frequencies. However, the reference characterized by I and -Q components is suppressed by the filter 77. Naturally, since the reference is I,-Q conditioned, as presented in FIG. 15b, it passes the filter for the negative frequencies, but it is blocked for the positive frequencies such that it does not appear with the main signal.

The filter is directly tuned with reference signal while simultaneously operating on the main signal. By choosing appropriate input amplitude of the reference, the reference output amplitude is set to be sufficiently small to not interfere with the main signal for a given type of signal modulation.

Any viable frequency-tuning technique including, but not limited to phase detection used in phase locked-loop Type I, or phase and frequency detection used in phase locked-loop Type II can be used to implement frequency-tuning circuit 44.

Any viable Q-tuning technique including, but not limited to amplitude detection using rectifiers and envelope-detectors can be used to implement frequency-tuning circuit 46.

The phase, phase/frequency, delay, or amplitude-locked loops used in frequency- and Q-tuning circuits 44 and 46 can be analog, mixed-mode, digital or software.

FIG. 16 illustrates a fully integrated heterodyne receiver 70 using the present filters 74 and 77. The signal from the antenna enters the input of the low-noise amplifier (LNA) circuit 72, the output of which is connected to filter 74. The output of filter 74 is then connected to the two inputs of the complex mixer circuit 76, which consists of two identical mixers fed by identical input signals and two LO signals shifted by 90 degrees (LO I and LO Q). The complex mixer has two outputs I and Q. They enter two inputs of filter 77. The I and Q outputs of filter 77 are connected to the input of the variable gain amplifier (VGA) circuit 78.

I claim:

1. A tuning system for continuous-time filters comprising:
   an active real band-pass filter for receiving an input signal and for generating an output signal in a signal path;
   a first tuning system connected to said active real band-pass filter for receiving an output signal from said active real band-pass filter and for generating a reference signal applied to said active real band-pass filter for tuning said active real band-pass filter while said active real band-pass filter is simultaneously operating on said input signal;
   said first tuning system includes a first frequency-tuning system and a first Q-tuning system;
   an active complex band-pass filter connected in said signal path for receiving an input signal on said signal path and for generating an output signal;
   a second tuning system connected to said active complex band-pass filter for receiving an output signal from said active complex band-pass filter and for generating a reference signal applied to said active complex band-pass filter for tuning said active complex band-pass filter while said active complex band-pass filter is simultaneously operating on said input signal on said signal path; and
   said second tuning system includes a second frequency-tuning system and a second Q-tuning system.

2. The tuning system of claim 1 wherein said first and second frequency-tuning systems each include:
   a limiter for receiving said input signal and for generating an output signal;
   a phase detector for receiving said output signal of said limiter and for generating an output signal; and
   a low pass filter for receiving to output of said phase detector and for generating said reference signal.

3. The tuning system of claim 2 wherein said phase detector includes a sequential phase detector.

4. The tuning system of claim 2 wherein said phase detector includes a XOR/XNOR phase detector.

5. The tuning system of claim 1 wherein said first and second Q-tuning systems each include:
   a low frequency biquad circuit for receiving said input signal and for generating an output signal;
   a pair of peak detectors for receiving said low frequency biquad circuit output signal and for generating a pair of output signals;
   a differential amplifier for receiving said pair of output signals from said peak detectors and for generating an output signal; and
   a low pass filter for receiving said amplifier output signal and for generating said reference signal.

6. The tuning system of claim 5 wherein the output signal of said low frequency biquad circuit is applied to a voltage divider.

7. A tuning system for continuous-time filters comprising:
   an active real band-pass filter for receiving an input signal and for generating an output signal in a signal path;

a first tuning system receiving an input real reference signal for tuning said first tuning system, said first tuning system being connected to said active real band-pass filter for receiving an output signal from said active real band-pass filter and for generating a control signal applied to said active real band-pass filter for tuning said active real band-pass filter while said active real band-pass filter is simultaneously operating on said input signal;

an active complex band-pass filter connected in said signal path for receiving an input signal on said signal path and for generating an output signal; and a second tuning system receiving an input complex reference signal for tuning said second tuning system, said second tuning system being connected to said active complex band-pass filter for receiving an output signal from said active complex band-pass filter and for generating a control signal applied to said active complex band-pass filter for tuning said active complex band-pass filter while said active complex band-pass filter is simultaneously operating on said input signal on said signal path.

8. The tuning system of claim 7 wherein said input complex reference signal includes a pair of I, -Q signals and an I, -Q low frequency reference signal.

9. The tuning system of claim 8 wherein said input signal to said active complex band-pass filter and said input complex reference signal are shifted by 90 degrees.

* * * * *